(12) United States Patent
Mi et al.

(10) Patent No.: US 10,290,767 B2
(45) Date of Patent: May 14, 2019

(54) HIGH EFFICIENCY VISIBLE AND ULTRAVIOLET NANOWIRE EMITTERS

(71) Applicant: THE ROYAL INSTITUTION FOR THE ADVANCEMENT OF LEARNING / MCGILL UNIVERSITY, Montreal (CA)

(72) Inventors: Zetian Mi, Verdun (CA); Songrui Zhao, Montreal (CA); Renjie Wang, Montreal (CA)

(73) Assignee: The Royal Institution for the Advancement of Learning/McGill University, Montreal, Quebec (CA)

( * ) Notice: Subject to any disclaimer, the term of this patent is extended or adjusted under 35 U.S.C. 154(b) by 201 days.

(21) Appl. No.: 15/177,608

(22) Filed: Jun. 9, 2016

(65) Prior Publication Data

US 2016/0365480 A1    Dec. 15, 2016

Related U.S. Application Data

(60) Provisional application No. 62/172,874, filed on Jun. 9, 2015.

(51) Int. Cl.
| | |
|---|---|
| H01L 33/06 | (2010.01) |
| H01L 33/08 | (2010.01) |
| H01L 33/32 | (2010.01) |
| H01L 33/00 | (2010.01) |
| H01S 5/10 | (2006.01) |
| H01S 5/323 | (2006.01) |
| H01L 33/18 | (2010.01) |
| H01S 5/02 | (2006.01) |
| H01S 5/40 | (2006.01) |

(52) U.S. Cl.
CPC ............ *H01L 33/06* (2013.01); *H01L 33/007* (2013.01); *H01L 33/08* (2013.01); *H01L 33/18* (2013.01); *H01L 33/32* (2013.01); *H01S 5/1042* (2013.01); *H01S 5/32341* (2013.01); *H01S 5/021* (2013.01); *H01S 5/4006* (2013.01)

(58) Field of Classification Search
CPC combination set(s) only.
See application file for complete search history.

(56) References Cited

PUBLICATIONS

Liu et al "Electrically Pumped Near-Ultraviolet Lasing from ZnO/MgO Core/Shell Nanowires"; Appl. Phys. Lett. 2011, 99, 063115.
(Continued)

*Primary Examiner* — Ratisha Mehta

(57) ABSTRACT

GaN-based nanowire heterostructures have been intensively studied for applications in light emitting diodes (LEDs), lasers, solar cells and solar fuel devices. Surface charge properties play a dominant role on the device performance and have been addressed within the prior art by use of a relatively thick large bandgap AlGaN shell covering the surfaces of axial InGaN nanowire LED heterostructures has been explored and shown substantial promise in reducing surface recombination leading to improved carrier injection efficiency and output power. However, these lead to increased complexity in device design, growth and fabrication processes thereby reducing yield/performance and increasing costs for devices. Accordingly, there are taught self-organizing InGaN/AlGaN core-shell quaternary nanowire heterostructures wherein the In-rich core and Al-rich shell spontaneously form during the growth process.

10 Claims, 14 Drawing Sheets

(56) References Cited

PUBLICATIONS

Chen et al "Room Temperature Excitonic Whispering Gallery Mode Lasing from High-Quality Hexagonal ZnO Microdisks", Adv. Mater. 2011, 23, 2199-2204.

Shin et al. "Directional Random Lasing in Dye-TiO2 Doped Polymer Nanowire Array Embedded in Porous Alumina Membrane", Appl. Phys. Lett. 2006, 88, 263112.

Liu et al., "Electrically Pumped Random Lasers Fabricated from ZnO Nanowire Arrays", Nanoscale 2012, 4, 2843.

Sakai et al., "Random Laser Action in GaN Nanocolumns", Appl. Phys. Lett. 2010, 97, 151109.

Lo et al., "Lasing at Exciton Transition in Optically Pumped Gallium Nitride Nanopillars", Opt. Exp. 2011, 19, 17960.

Yu et al.,"Random Laser Action in ZnO Nanorod Arrays Embedded in ZnO Epilayers", Appl. Phys. Lett. 2004, 84, 3241.

Hui et al., "Review on Latest Developments in Random Lasers with Coherent Feedback", J. Phys. A: Math. Gen. 2005, 38, 10497.

Nakamura et al., "InGaN-Based Laser Diodes", Japan Society of Applied Physics, No. 1, 5-17, 2000.

Narukawa et al., "Role of Self-Formed InGaN Quantum Dots for Exciton Localization in the Purple Laser Diode Emitting at 420 nm", Appl. Phys. Lett. 1997, 70, 981.

Chichibu et al., "Origin of Defect-Insensitive Emission Probability in In-Containing (Al,In,Ga)N Alloy Semiconductors", Nature Mater 2006, 5, 810.

Krestnikov et al., "Quantum Dot Origin of Luminescence in InGaN—GaN Structures", Phys. Rev. B 2002, 66, 155310.

Moustakas et al., "Growth of III-Nitride Quantum Dots and their Applications to Blue-Green LEDs", J. Phys. Stat. Sol. (a) 2008, 205, 2560.

Pierret et al., "Growth, Structural and Optical Properties of AlGaN Nanowires in the Whole Composition Range", Nanotechnol. 2013, 24, 115704.

Verma et al, "Tunnel-Injection Quantum Dot Deep-Ultraviolet Light-Emitting Diodes with Polarization-Induced Doping in III-nitride Heterostructures", Appl. Phys. Lett. 2014, 104, 021105.

Pecora et al, "Sub-250 nm Room-Temperature Optical Gain from AlGaN/AIn Multiple Quantum Wells with Strong Band-Structure Potential Fluctuations", Appl. Phys. Lett. 2012, 100, 061111.

Korakakis et al, "Long Range Order in AlxGa1-xN Films Grown by Molecular Beam Epitaxy", Appl. Phys. Lett. 1997, 71, 72.

Himwas et al., "Alloy Inhomogeneity and Carrier Localization in AlGaN Sections and AlGaN/AIn Nanodisks in Nanowires with 240-350 nm Emission", Appl. Phys. Lett. 2014, 105, 241908.

Zhang et al.,"On the Carrier Injection Efficiency and Thermal Property of InGaN/GaN Axial Nanowire Light Emitting Diodes", IEEE J. Quan. Electron. 2014, 50, 483.

Nguyen et al. Breaking the Carrier Injection Bottleneck of Phosphor-Free Nanowire White Light-Emitting Diodes Nano Lett. 2013, 13, 5437.

Chang et al., "High Efficiency Green, Yellow, and Amber Emission from InGaN/GaN Dot-in-a-Wire Heterostructures on Si(111)", Appl. Phys. Lett. 96, 013106 (2010).

Nguyen et al., "p-Type Modulation Doped InGaN/GaN Dot-in-a-Wire White-Light-Emitting Diodes Monolithically Grown on Si(111)", Nano Lett. 11, 1919 (2011).

Nguyen et al., "Breaking the Carrier Injection Bottleneck of Phosphor-Free Nanowire White Light-Emitting Diodes", Nano Lett. 13, 5437 (2013).

Demichel et al., "Impact of Surfaces on the Optical Properties of GaAs Nanowires", Appl. Phys. Lett. 97, 201907 (2010).

Nguyen et al., "Engineering the Carrier Dynamics of InGaN Nanowire White Light-Emitting Diodes by Distributed p-AlGaN Electron Blocking Layers", Sci. Rep. 5, 7744 (2015).

Bavencove et al., "Submicrometre Resolved Optical Characterization of Green Nanowire-Based Light Emitting Diodes", Nanotechnology 22, 345705 (2011).

Yoshida et al, "Demonstration of an Ultraviolet 336nm AlGaN Multiple-Quantum Well Laser Diode", Appl. Phys. Lett. 93, 241106 (2008).

Wang et al, "High Efficiency Ultraviolet Emission from AlxGa1-xN Core-Shell Nanowire Heterostrucutres Grown on Si (11) by Moledcular Beam Epitaxy", Appl. Phys. Lett. 101, 043115.

Jahangir et al., "Molecular Beam Epitaxial Growth and Optical Properties of Red-Emitting (650nm) InGaN/GaN Disks-in-Nanowires on Silicon", Appl. Phys. Lett. 102, 071101.

Zhao et al., "An Electrically Injected AlGaN Nanowire Laser Operating in the Ultraviolet C-Band", Appl. Phys. Lett. 107, 043101.

Zhao et al., "Three-Dimensional Quantum Confinement of Charge Carriers in Self-Organized AlGaN Nanowires: A Viable Route to Electrically Injected Deep Ultraviolet Lasers", Nano. Lett. 15 (12), pp. 7801-7807.

Miyamura et al., "UV Photoluminescence from Size Controlled GaN Quantum Dots Grown by MOCVD", Phys. Stat. Sol. (A) 192(1), pp. 33-38.

Kim et al., "High Brightness Light Emiiting Diodes using Dislocation-Free Indium Gallium Nitride / Gallium Nitride Multi-Quantum Well Nanorod Attay", Nano. Lett. 4(6), pp. 1059-1062.

Li et al., "Ultralow-Threshold Electrically Injected AlGaN Nanowire Ultraviolet Lasers on Si Operating at Low Temperature", Nat. Nano. 10, pp. 140-144.

Nguyen et al.,"High-Efficiency InGaN/GaN Dot-in-a-Wire Red Light-Emitting Diodes", IEEE Phot. Tech. Lett., 24(4), 4221-323.

HIGH EFFICIENCY VISIBLE AND ULTRAVIOLET NANOWIRE EMITTERS

CROSS-REFERENCE TO RELATED APPLICATIONS

This application claims the benefit of priority from U.S. Provisional Patent Application Ser. No. 62/172,874 filed Jun. 9, 2015 entitled "High Efficiency Visible and Ultraviolet Nanowire Emitters."

STATEMENT OF GOVERNMENT INTEREST

This invention was made with U.S. Government support under grant W911NF-12-1-0477 awarded by U.S. Army Research Office. The U.S. Government has certain rights in this invention.

FIELD OF THE INVENTION

This invention relates to semiconductor nanowire devices and more particularly to ultraviolet emitters, self-organized nanoclusters, Anderson localization, and self-organized elementally rich shells.

BACKGROUND OF THE INVENTION

Compound semiconductor nanowire structures allow broad spectrum photonic devices to be implemented with a single growth process thereby greatly increasing the efficiency of devices exploiting them such as solar cells and light emitting diodes (LEDs), for example, and reducing their costs. To date solid state emitters exploiting compound semiconductor nanowires have been demonstrated in a range of materials for different wavelength ranges as depicted in Table 1. However, more recently improved growth techniques, improved understanding of the effects affecting performance, the introduction of graded growth and self-organizing quantum structures have allowed multiple emitters to be integrated within the same nanowire to provide white LEDs as well as increasing emission efficiency. For example, InGaN nanowires have been demonstrated from the red-amber side of the spectrum through to the blue-violet side and near ultraviolet (UV) down to approximately 325-350 nm.

TABLE 1

Examples of Semiconductor Alloys for LEDs

| | Wavelength | Semiconductor System |
|---|---|---|
| Mid-Infrared | $\lambda \geq 1100$ nm | InGaAsP |
| Infrared | $\lambda \geq 760$ nm | GaAs, AlGaAs |
| Red | 610 nm $\leq \lambda \leq$ 760 nm | AlGaAs, GaAsP, AlGaInP, GaP |
| Orange | 590 nm $\leq \lambda \leq$ 610 nm | GaAsP, AlGaInP, GaP, InGaN, |
| Yellow | 570 nm $\leq \lambda \leq$ 590 nm | GaAsP, AlGaInP, GaP, InGaN |
| Green | 500 nm $\leq \lambda \leq$ 590 nm | GaP, AlGaInP, AlGaP, InGaN, |
| Blue | 450 nm $\leq \lambda \leq$ 500 nm | Zinc selenide (ZnSe), InGaN, GaN |
| Violet | 400 nm $\leq \lambda \leq$ 450 nm | InGaN, GaN |
| Ultraviolet | $\lambda \leq 400$ nm | Boron nitride (BN), AlN, AlGaN, AlGaInN |

Despite the progress in electrically injected semiconductor lasers in the visible, infrared, and terahertz wavelength ranges it has remained difficult to realize electrically injected semiconductor lasers or efficient light emitting diodes (LEDs) within the rich deep ultraviolet (UV) spectrum 10-21. Bridging this deep UV gap would allow the replacement of conventional mercury lamps by efficient solid-state UV light sources for a broad range of applications, including water purification, disinfection, bio-chemical detection, medical diagnostics, and materials processing, to name a few. In this context, AlGaN-based materials, with a direct energy bandgap in the range of 3.4 eV to 6.1 eV, have been intensively studied.

However, whilst optically pumped AlGaN quantum well lasers UV-B and UV-C bands have been demonstrated these have had relatively high thresholds as a result of the properties of conventional AlGaN materials including the large bandgap and large effective mass for both electrons and holes. Reducing this can be achieved by modifying the density of states (DOS) using quantum-confined nanostructures, such as quantum dots and quantum wires. With the use of such low-dimensional nanostructures, semiconductor lasers with significantly enhanced gain and differential gain have demonstrated. Quantum dot-like nanoclusters can also be induced by phase separation where, for example, the presence of In-rich nanoclusters has been commonly observed in InGaN-based quantum well lasers; and the resulting carrier localization has been identified as one of the major factors contributing to the excellent performance of GaN-based quantum well lasers operating in the near-UV, blue, and blue-green spectral ranges. However, the relatively small lattice mismatch (a maximum of 3% between GaN and AlN), has to date prohibited the realization of electrically injected quantum dot lasers in the deep UV band.

Accordingly, it would be beneficial to establish the formation of self-organized Ga(Al)N quantum dots in the deep UV spectral range allowing low-dimensional quantum-confined nanostructures, such as quantum dots and quantum wires, to be achieved allowing deep UV semiconductor lasers with significantly enhanced gain and differential gain to be implemented.

GaN-based nanowire heterostructures have been intensively studied for applications in light emitting diodes (LEDs), lasers, solar cells and solar fuel devices. Recent studies have shown that the surface charge properties play a dominant role on the device performance such that for the commonly reported axial nanowire LED designs they exhibit very low output power as a result of the large surface recombination and resulting poor carrier injection efficiency. Radial variations of In/Ga distribution have been observed in InGaN/GaN dot/disk/well-in-a-wire heterostructures. However, such radial variations were found to be insufficient to suppress non-radiative surface recombination under electrical injection. In this regard, the use of a large bandgap AlGaN shell covering the surfaces of axial InGaN nanowire LED heterostructures has been explored and shown substantial promise in reducing surface recombination leading to improved carrier injection efficiency and output power. In these approaches, however, either relatively thick AlGaN layers were grown either on the top p-GaN region of the InGaN/GaN nanowires or incorporated within the device active regions, In each case the intention being to form an AlGaN shell for surface passivation. However, each approach leads to increased complexity in the device design, growth and fabrication processes thereby reducing yield/performance and increasing costs for devices. Moreover, a fundamental understanding of the impact of the AlGaN shell structure on the carrier dynamics and device performance has remained elusive.

Accordingly, it would be beneficial to provide designers of semiconductor nanowire emitting devices and their manufacturing operations with a means of implementing InGaN/AlGaN core-shell quaternary nanowire heterostructures wherein the In-rich core and Al-rich shell spontaneously form during the growth process. It would be further beneficial for these core-shell quaternary nanowire heterostructures to be tunable in emission wavelength across the visible spectral range allowing discrete high efficiency coloured nanowire LEDs, multi-colour high efficiency nanowire LEDs, and white high efficiency nanowire LEDs to be formed through adjustments in the growth parameters. Further, the inventors beneficially establish a direct correlation between the output power, carrier lifetime, and shell thickness to provide a robust, large bandgap shell structure methodology for dramatically enhancing the performance of axial nanowire LEDs for the solid state lighting and display applications.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations in the prior art relating to relates to semiconductor nanowire devices and more particularly to ultraviolet emitters, self-organized nanoclusters, Anderson localization, and self-organized elementally rich shells.

In accordance with an embodiment of the invention there is provided a method of forming atomic scale compositional modulations within a compound semiconductor nanowire to form three dimensional quantum confinement of charge carriers by increasing the concentration of a predetermined element within the composition of the compound semiconductor above a threshold.

In accordance with an embodiment of the invention there is provided a device comprising:
a plurality of nanowires grown on a substrate having diameters over a predetermined region of their length within a predetermined range of diameters and having a predetermined fill factor over a predetermined region of the substrate;
upper and lower electrical contacts formed on the plurality of nanowires of the predetermined region of the substrate; wherein
the plurality of nanowires coherently emit optical radiation through the Anderson localization of light.

In accordance with an embodiment of the invention there is provided a method comprising:
growing a plurality of nanowires on a substrate having diameters over a predetermined region of their length within a predetermined range of diameters and having a predetermined fill factor over a predetermined region of the substrate;
forming upper and lower electrical contacts formed on the plurality of nanowires of the predetermined region of the substrate; wherein
the plurality of nanowires coherently emit optical radiation through the Anderson localization of light.

In accordance with an embodiment of the invention there is provided a method of suppressing non-radiative surface recombination within a structure formed from a compound semiconductor comprising at least a predetermined first Group III element, a predetermined second Group III element, and a predetermined Group V element by establishing within a predetermined portion of the structure a region richer in concentration of the predetermined first Group III element within a core region of the structure than an outer region of the structure and richer in concentration of the predetermined second Group III element within the outer region of the structure than the core region of the structure.

In accordance with an embodiment of the invention there is provided a device comprising:
a substrate;
a plurality of nanowires formed from a single compound semiconductor over a predetermined portion of their length, the single compound semiconductor within the predetermined portion of the nanowire comprising at least a predetermined first Group III element, a predetermined second Group III element, and a predetermined Group V element, wherein within the predetermined portion of the nanowire the predetermined first and second Group III elements have radial profiles, wherein
the radial profile of the predetermined first Group III element is richer in concentration within a core region of the nanowire than an outer region of the nanowire; and
the radial profile of the predetermined second Group III element is richer element within the outer region of the nanowire than the core region of the nanowire; and
upper and lower electrical contacts electrically connected to opposing ends of the plurality of nanowires.

In accordance with an embodiment of the invention there is provided a method comprising:
providing a substrate;
growing a plurality of nanowires formed from a single compound semiconductor over a predetermined portion of their length, the single compound semiconductor within the predetermined portion of the nanowire comprising at least a predetermined first Group III element, a predetermined second Group III element, and a predetermined Group V element, wherein within the predetermined portion of the nanowire the predetermined first and second Group III elements have radial profiles, wherein
the radial profile of the predetermined first Group III element is richer in concentration within a core region of the nanowire than an outer region of the nanowire; and
the radial profile of the predetermined second Group III element is richer element within the outer region of the nanowire than the core region of the nanowire; and
forming upper and lower electrical contacts electrically connected to opposing ends of the plurality of nanowires.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention is directed to semiconductor nanowire devices and more particularly to ultraviolet emitters, self-organized nanoclusters, Anderson localization, and self-organized elementally rich shells.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

A. Ultraviolet Nanowire Light Source

A1. Fabrication

Figure 1A:
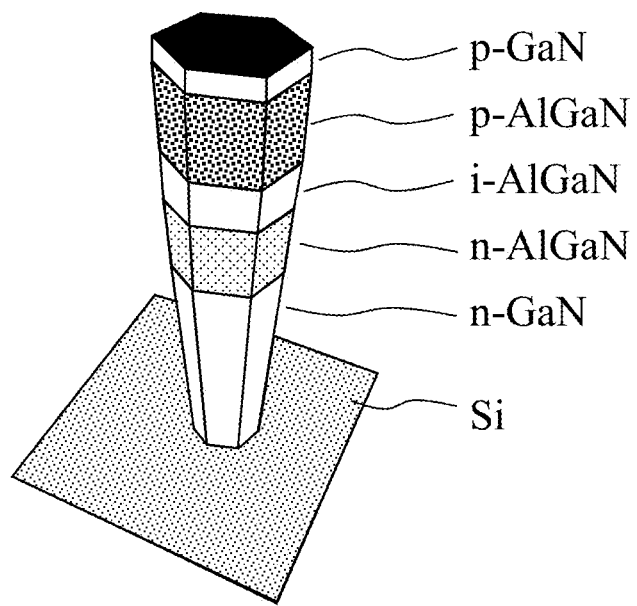
FIG. 1A depicts a schematic of an AlGaN nanowire laser structure according to an embodiment of the invention.
Figure 1B:
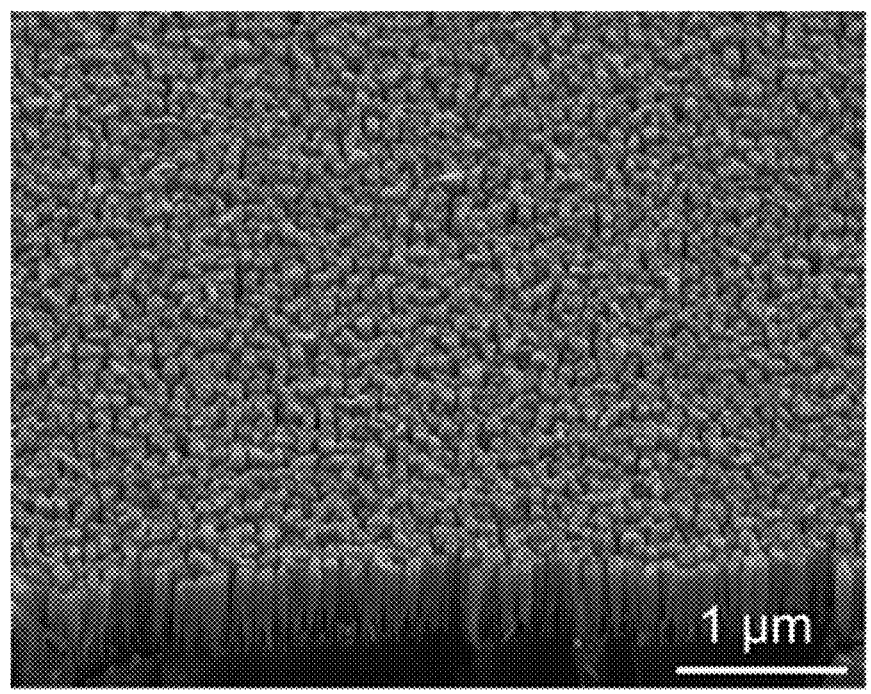
FIG. 1B depicts an SEM image of self-organized AlGaN nanowire arrays formed on silicon.

The inventors grew catalyst-free AlGaN nanowires directly onto Si substrates using a radio frequency plasma-assisted molecular beam epitaxy (MBE) system under nitrogen rich conditions. The Si wafers were cleaned by standard solvents prior to loading into the system after which the Si surface oxide was thermally desorbed at 780° C. in situ. Before growth initiation, a thin Ga seeding layer was utilized to promote the nanowire formation. Schematically shown in FIG. 1A, the grown nanowire structure consists of Si-doped GaN (~250 nm), AlGaN p-i-n junction (each layer ~100 nm), and a thin (~10 nm) Mg-doped GaN contact layer. The growth conditions include a nitrogen flow rate at 1.0 standard cubic centimeter per minute (sccm), a forward plasma power of 350 W, Ga beam equivalent pressure (BEP) in the range of $1 \times 10^{-8} \leq Ga_{BEP} \leq 6 \times 10^{-8}$ Torr, and Al BEP in the range of $1 \times 10^{-8} \leq Al_{BEP} \leq 4 \times 10^{-8}$ Torr. The growth temperatures for GaN and AlGaN layers were 780° C. and 800° C., respectively. The Si and Mg concentrations for n- and p-AlGaN regions were estimated to be ~$1 \times 10^{18}$ cm$^{-3}$ and ~$1 \times 10^{20}$ cm$^{-3}$. The typical SEM image taken with a 45-degree angle of such AlGaN nanowires is shown in FIG. 1B. It is seen that the nanowires possess great size uniformity in terms of the nanowire length and diameter.

Figure 1C:
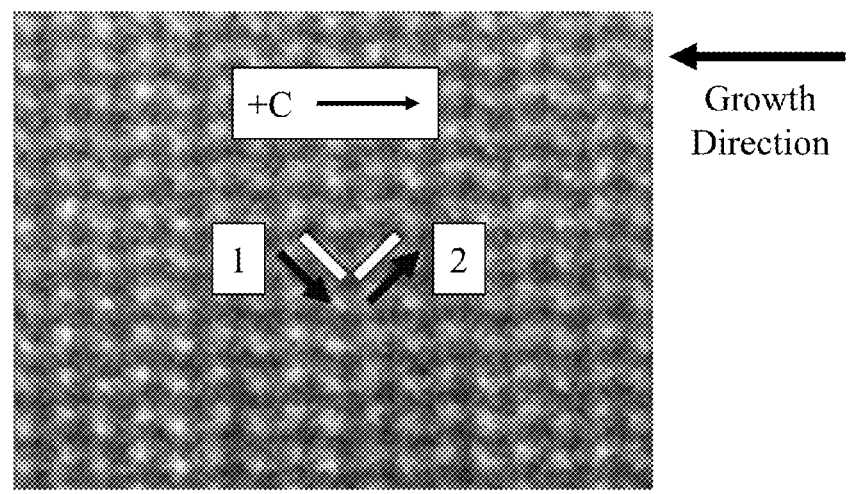
FIG. 1C depicts an atomic-resolution image taken from a p-AlGaN nanowire section grown according to an embodiment of the invention.
Figure 1D:
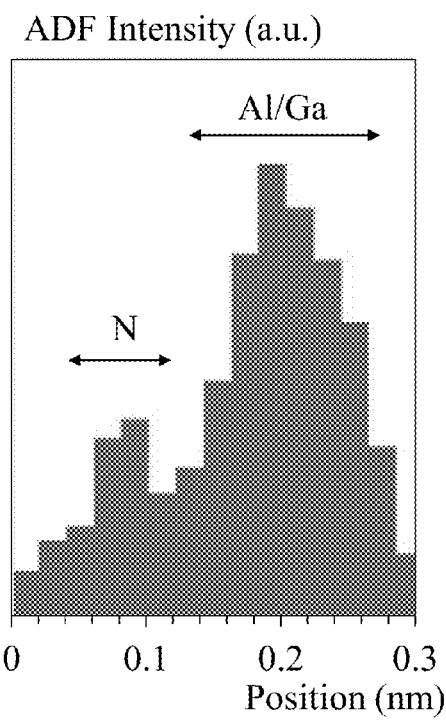
FIGS. 1D and 1E respectively depict line profiles across pairs of adjacent atomic dumbbells within FIG. 1C directly confirming the N-polarity of AlGaN nanowires grown according to an embodiment of the invention in FIG. 1C.
Figure 1E:
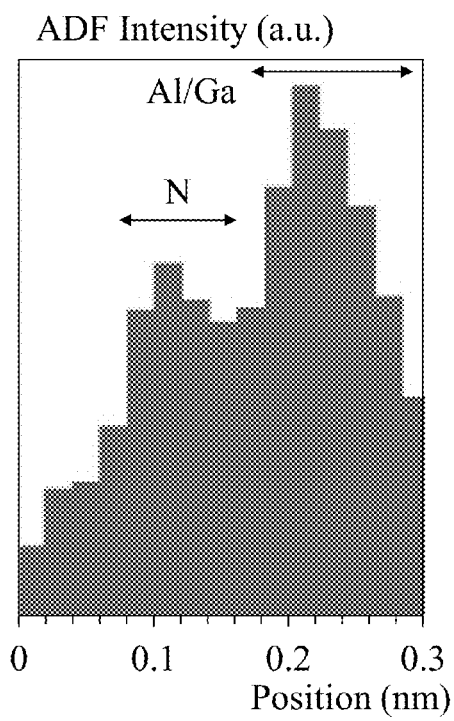

The crystal polarity of the wurtzite-structured AlGaN nanowires observed along the <11$\bar{2}$0> orientation (a-plane) was directly determined from the HAADF image intensity across adjacent atomic dumbbells within the high Al-content AlGaN, such as depicted in FIG. 1C. The low-Z N-atoms are visible in the proximity of the weaker scattering Al-atoms in comparison to the strong scattering from Ga-atoms in GaN. A detailed investigation of the atomic structure in FIG. 1C shows elongation of the group III column alternating diagonally left and right. The corresponding line profiles of the ADF intensity from the pair of marked atomic dumbbells in FIG. 1C are displayed in FIGS. 1D and 1E, confirming that the presented AlGaN nanowires are N-polar.

Figure 1F:
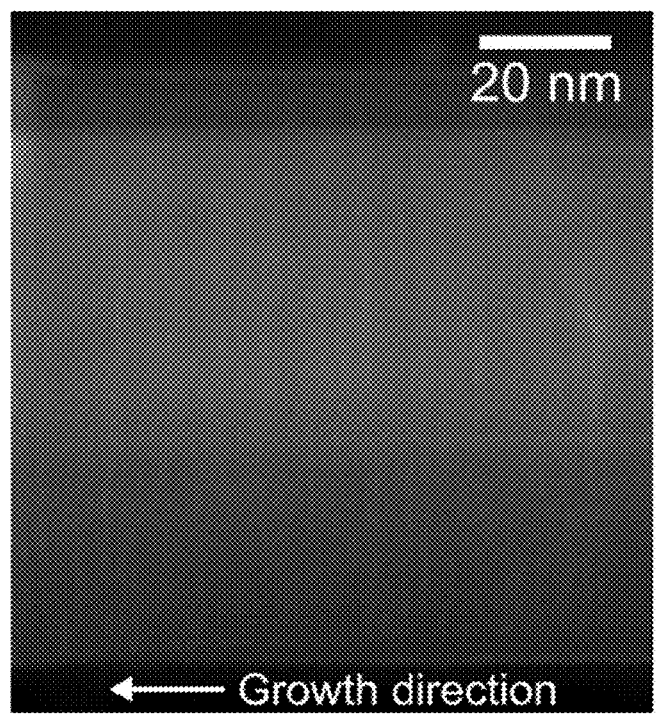
FIG. 1F depicts a STEM-HAADF Z-contrast image taken from a p-AlGaN region of high Al concentration nanowire according to an embodiment of the invention indicating an Al-rich shell near the nanowire surface.
Figure 1G:
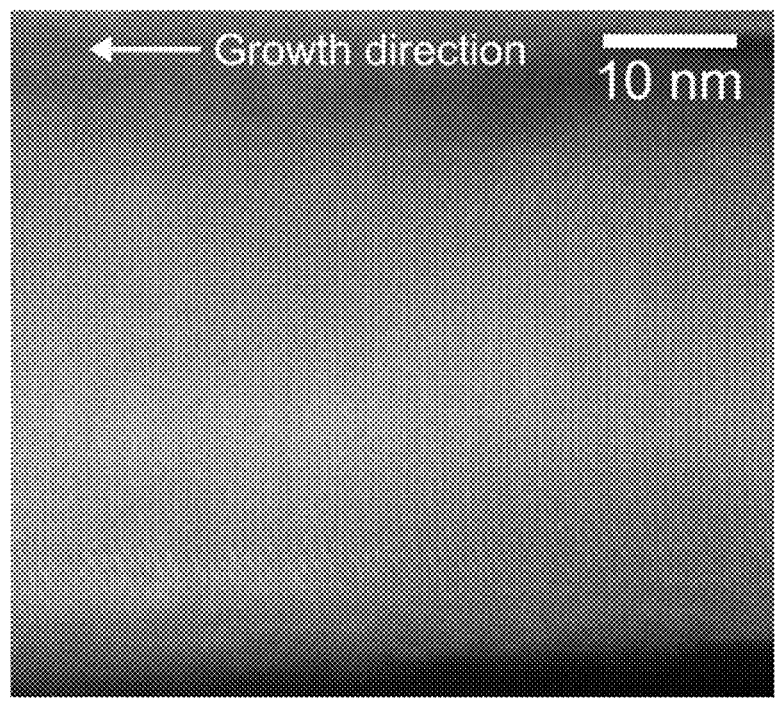
FIG. 1G depicts a STEM-HAADF Z-contrast image taken from an i-AlGaN region of high Al concentration nanowire according to an embodiment of the invention indicating the presence of atomic-scale compositional fluctuations.

Now referring to FIG. 1F there is depicted a low magnification Z-contrast image of p-AlGaN region of a high Al concentration nanowire along the <1$\bar{1}$00> orientation (m-plane). It is seen that besides the compositional modulations as described in the main text, a few nm thick Al-rich AlGaN shell can be seen (darker region) near the surface, which is further surrounded by Ga-rich outermost shell. This is similar to that observed in the low Al concentration nanowires. The atomic-scale compositional modulations can also be observed in the i- and n-AlGaN regions in the high Al concentration nanowire. Shown in FIG. 1G is a low magnification Z-contrast image of the i-AlGaN region along the a-plane of a separate nanowire where it can be seen that similar compositional modulations also exist.

A2. Characterisation

Figure 2A:
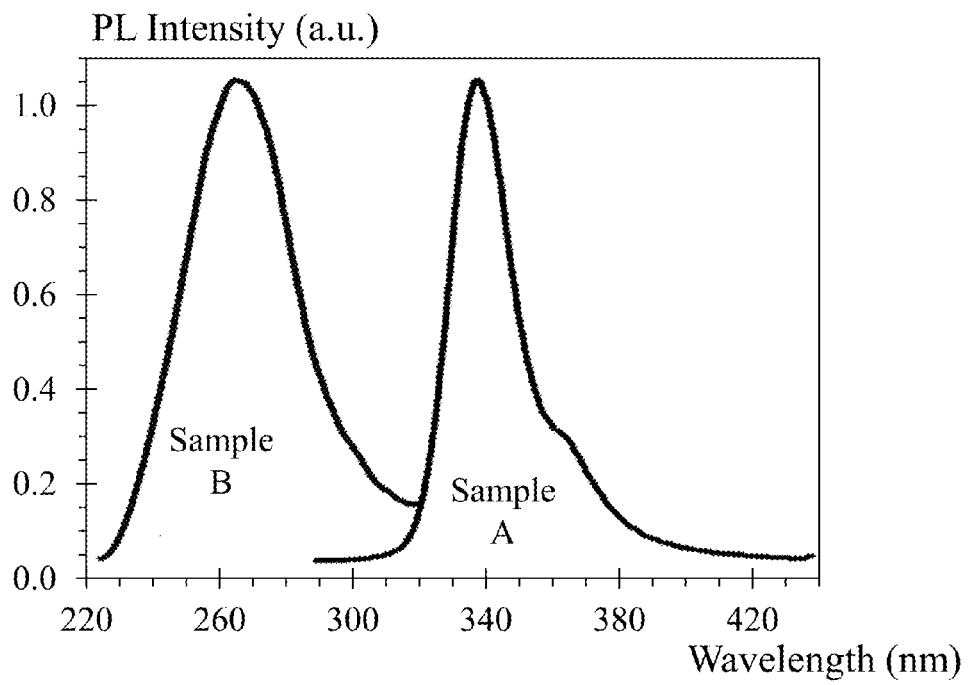
FIG. 2A depicts room temperature photoluminescence spectra for AlGaN nanowires according to embodiments of the invention with low and high Al concentrations.
Figure 2B:
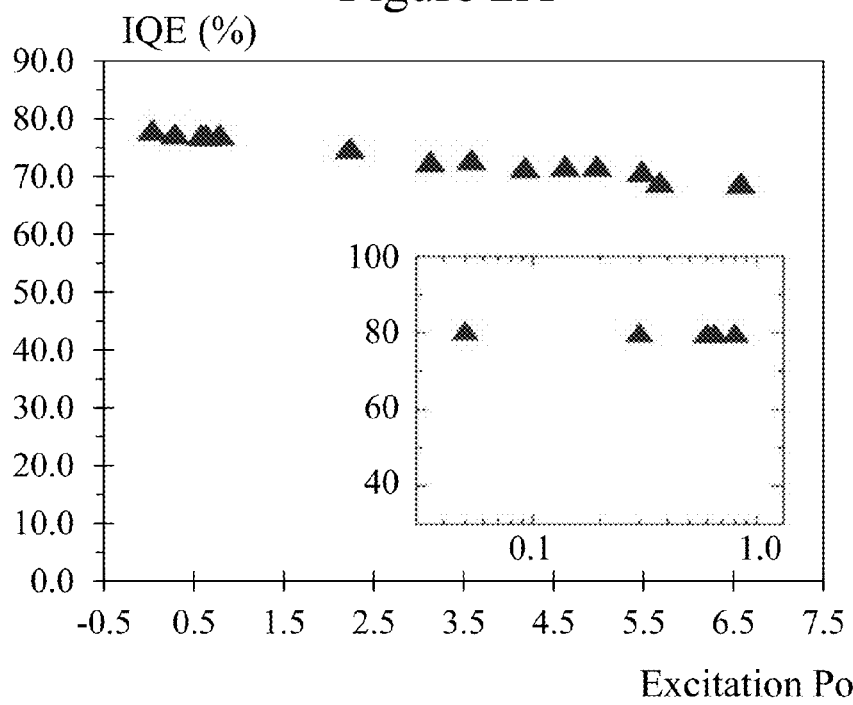
FIG. 2B depicts the variation of internal quantum efficiency with excitation power for AlGaN nanowires according to embodiments of the invention with high Al concentration.

Optical properties of AlGaN nanowires grown according to embodiments of the invention were studied using temperature variable photoluminescence (PL) spectroscopy. Show in FIG. 2A are the photoluminescence (PL) spectra measured at room-temperature for two representative nanowire samples, including a low Al concentration (10% by the nominal BEP ratio) and high Al concentration sample (70% by the nominal BEP ratio), denoted as Samples A and B, respectively. Sample A was excited by a 266 nm diode-pumped solid state laser, while sample B was excited by a 193 nm ArF excimer laser. The collected PL emission was spectrally resolved and detected by a photomultiplier tube detector. Compared to Sample A, the spectral linewidth of Sample B is about twice as broad, which can be ascribed to the presence of atomic-scale compositional modulations, i.e., quantum-dot/dash-like nanostructures in AlGaN nanowires (as described and discussed below). The luminescence efficiency was further estimated by comparing the integrated PL intensity at room-temperature with that measured at 10 K, assuming the luminescence efficiency at 10 K to be unity. In practice, it is noted that the luminescence efficiency at 10 K also varies with the excitation power and other factors; therefore, it is necessary to examine the efficiency over a broad range of excitation powers. Shown in FIG. 2B is the internal quantum efficiency (IQE) of AlGaN nanowires according to embodiments of the invention as a function of excitation power for Sample B. It can be seen that the estimated efficiency stays nearly constant in the range of 70-80% over two orders of magnitude variations in the excitation power. This luminescence efficiency is significantly higher than previously reported AlGaN nanowires, which can be largely ascribed to the strong carrier confinement due to the presence of quantum dot/dash-like nanostructures (as described and discussed below).

Figure 3A:
FIG. 3A depicts STEM-HAADF image of a AlGaN nanowire according to an embodiment of the invention with low Al concentration.
Figure 3B:
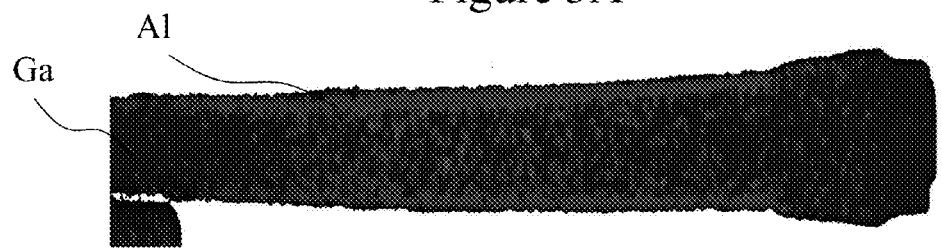
FIG. 3B depicts pseudo-color EELS-SI map of an AlGaN nanowire according to embodiments of the invention with low Al concentration showing Ga and Al elemental distributions.
Figure 3C:
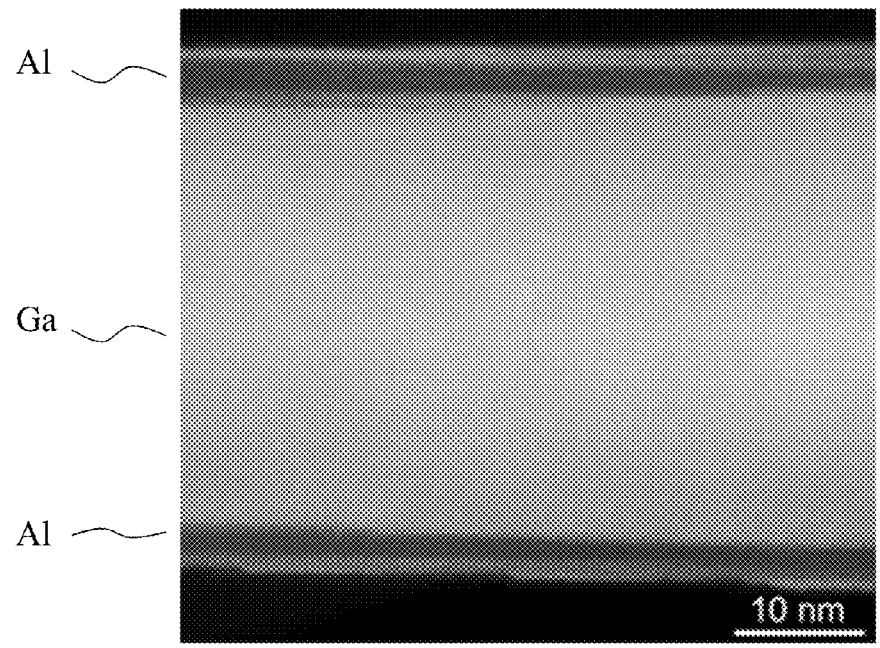
FIG. 3C depicts a high-magnification image from the boxed region in FIG. 3A showing uniform Ga and Al distribution in the nanowire bulk region.

Detailed structural characterization of Samples A and B were performed by high-resolution scanning transmission electron microscope (STEM). FIG. 3A shows the high-angle annular dark-field (HAADF) Z-contrast image of a single AlGaN nanowire from Sample A taken with a double aberration corrected STEM under 200 kV. It is seen that the nanowire has a length of ~600 nm and a top diameter of '50 nm, with an inversely tapered morphology. Electron energy-loss spectroscopy spectrum imaging (EELS-SI) was further performed to study the elemental distribution. Lateral profile of Ga-map suggests that a hexagonal cross-section with m-plane facets maintained all along the nanowire. Shown in FIG. 3B, a pseudo-color image of Ga- and Al-signals suggests a low Al concentration in the core region and a high Al concentration in the shell region. The formation of such core-shell nanowire structures can significantly suppress non-radiative surface recombination and increase the carrier injection efficiency of nanowire LEDs and lasers. Shown in FIG. 3C is a high-resolution image taken from the marked region in FIG. 3A. The aforementioned Al-rich AlGaN shell near the nanowire surface (dark region) can be observed; in addition, this Al-rich AlGaN shell is further surrounded by a few atomic-plane thick Ga-rich AlGaN outermost shell. One other important feature to point out is, for such a low Al concentration, the nanowire bulk region shows highly uniform compositional distribution.

Figure 3D:
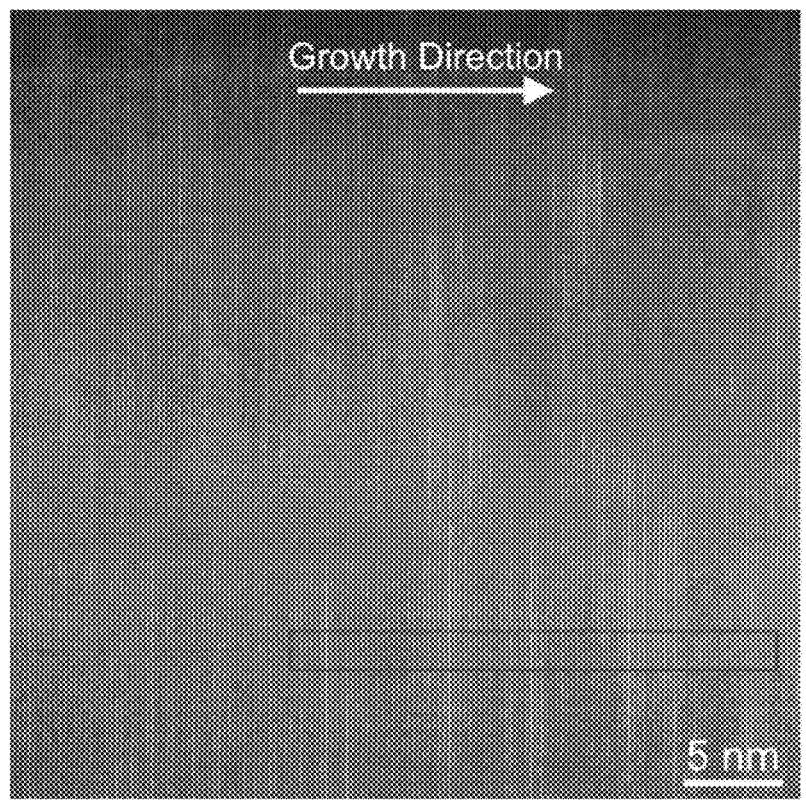
FIG. 3D depicts a high-magnification image from a p-AlGaN nanowire according to an embodiment of the invention with high Al concentration.
Figure 3E:
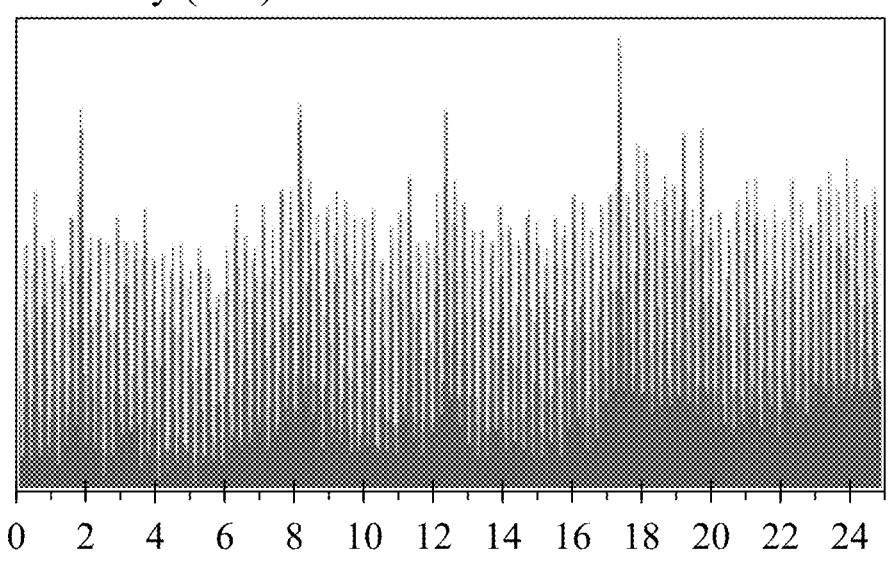
FIG. 3E depicts a line profile from the boxed region in FIG. 3D depicting the (brighter) AlGaN quantum dash-like nanostructures.

With increasing Al concentration, the presence of Al-rich AlGaN shell near the surface region can also be observed (as described and depicted in respect of FIGS. 1E and 1F); however, in contrast to Sample A (low Al concentration sample), strong atomic-scale compositional fluctuations were formed within the AlGaN layers in Sample B (high Al concentration sample). Illustrated in FIG. 3D is a high-magnification Z-contrast image from the p-AlGaN region of one AlGaN nanowire from Sample B. The presence of extensive atomic-scale Ga-/Al-rich modulations along the growth direction can be clearly observed. In addition, the Ga-rich AlGaN (brighter region) is not continuous along the lateral direction (perpendicular to the growth direction). Such Ga-rich AlGaN regions have sizes varying from a single atomic layer (~0.25 nm) to 2 nm along the growth direction, and lateral sizes varying from 2 to 10 nm. A line profile from the boxed region in FIG. 3D is shown in FIG. 3E. The localized variations in the Ga-concentration are estimated to be 5-10 at %. Moreover, both m- and a-plane orientation views of the Ga-rich AlGaN regions suggest that the Ga-rich regions make up a large portion of the projected thickness within the nanowire diameter (in order to be detectable), which, together with the observed lateral discontinuity, indicates that the atomic-scale fluctuations possess quantum dot/dash-like characteristics. It is further noted that such atomic-scale compositional modulations can be also observed in i- and n-AlGaN regions (as described and depicted in respect of FIG. 1F).

Figure 4A:
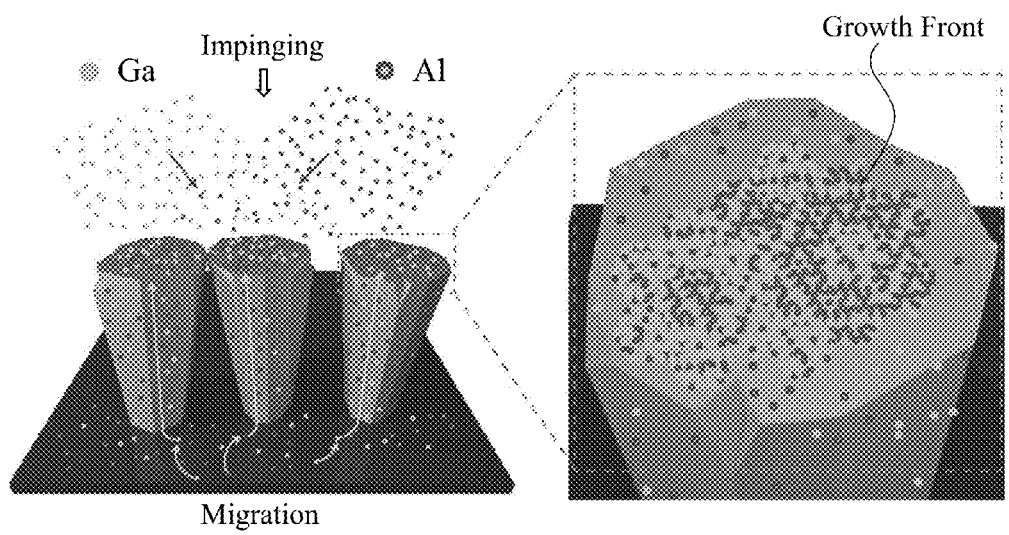
FIG. 4A depicts schematically the formation of AlGaN nanowires according to embodiments of the invention.

The formation process of such quantum dot/dash-like features is related to the interplay between spontaneous chemical ordering and anisotropic atom migration from the irregular top/lateral surfaces of nanowire arrays. Previously, the spontaneous formation of Al-rich and Ga-rich layers was observed and explained by the significantly different binding energies between Ga—N and Al—N. Such spontaneous chemical ordering alone, however, cannot explain the formation of quantum dot/dash-like nanostructures. The inventors show through the embodiments of the invention that, due to the random nucleation and formation process as well as the shadowing/coalescence effect of neighboring nanowires, self-organized AlGaN nanowires tend to develop into non-symmetric shapes, which strongly affects the diffusion of Al and Ga atoms along the sidewalls during the subsequent growth process. This effect, together with the difference in surface migration rates between Ga and Al atoms, can strongly modulate the spontaneous chemical ordering process at the growth front. As such, quantum dot/dash-like nanostructures are formed in self-organized AlGaN nanowire arrays, illustrated in FIG. 4A. Effects of such compositional variations on the optical properties of AlGaN nanowires are manifested by the broad PL spectral linewidth as well as the extremely high luminescence efficiency (~80%) at room temperature, shown in FIGS. 2A and 2B. Due to the large effective mass of charge carriers in Al-rich AlGaN, the Bohr radii are only 1-2 nm, which is comparable to the size variations of the observed quantum dots and dashes. As a consequence, they can provide strong 3D quantum confinement. Moreover, such local compositional variations also induce strong perturbation to the energy band, due to the changes in the polarization fields.

Figure 5A:
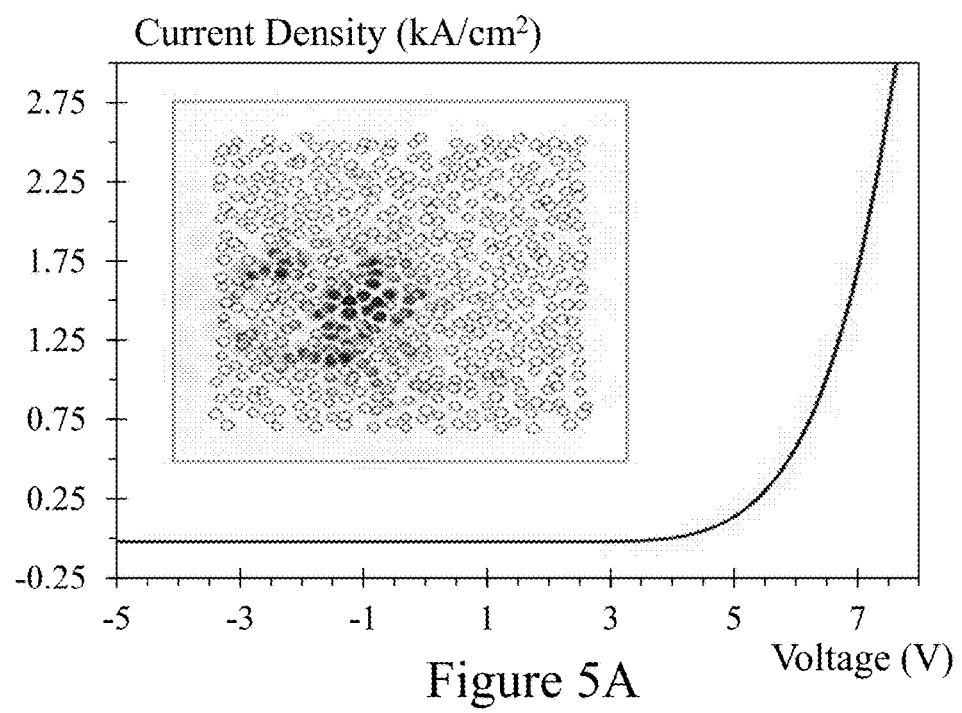
FIG. 5A depicts I-V characteristics of AlGaN nanowire lasers according to embodiments of the invention together with simulated electrical field distribution $\lambda=290$ nm.

Within the prior art it has been shown that such random nanowire arrays can function as a high Q optical cavity, due to the Anderson localization of light. Optically pumped lasing has been realized in GaN nanowires utilizing such random cavities. More recently, the inventors have demonstrated electrically-injected AlGaN nanowire lasers operating in the UV-AII band. The inventor's analysis suggests that such AlGaN nanowires, with optimized size and density, can lead to strong optical confinement in the deep UV bands (as described and depicted in respect of FIG. 5F). The optical cavity is formed due to the multiple scattering processes in the randomly distributed AlGaN nanowire arrays. The vertical optical confinement is further made possible by the inversely tapered geometry of nanowires, as illustrated in FIGS. 1 and 3A. Shown in the inset of FIG. 5A is the simulated electric field distribution of confined photons ($\lambda$=290 nm) in the lateral dimension of near-randomly distributed AlGaN nanowires (as described and depicted in respect of FIG. 5F and Section A3).

A3. Light Confinement in Self-Organized AlGaN Nanowire Arrays

Previously, lasing phenomena has been observed in disordered nanowire arrays of various material systems. Strong light localization becomes possible as photons are recurrently scattered among disordered nanowires, due to the interference of scattered waves. The geometry parameters of nanowires play important roles in achieving effective optical confinement.

The presence of any possible modes around $\lambda$=290 nm was calculated by the RF module of Comsol Mulitphysics software. The simulation was performed by varying the average nanowire diameters (d) and filling factors (F) repetitively over a wide range. In each simulation, the nanowire positions were generated randomly, and their sizes were also randomly varied in the range of $0.85d \leq \phi \leq 1.15d$. Such considerations were based on the SEM measurements of self-organized AlGaN nanowire arrays on Si. The probability of finding high quality-factor (Q) modes at $\lambda$=290 nm was then investigated by the Monte Carlo method. Referring to FIG. 5F, effective optical confinement can be readily achieved for nanowire diameters in the range of 60 nm$\leq$d$\leq$75 nm and filling factors in the range of 15%$\leq$F$\geq$55%. For comparison, the average diameters of self-organized AlGaN nanowires are d~65 nm, and the average filling factor is F~30% taking into account the inversely tapered nanowire geometry. Self-organized AlGaN nanowires with such size distributions were achieved by carefully optimizing the growth conditions, including the substrate temperature, growth rate, and nitrogen flux. Additionally, optical confinement along the vertical direction was made possible by the effective index guiding of the AlGaN nanowire arrays along the growth direction. Due to the inversely tapered geometry, the effective refractive index reaches minimum at the bottom of nanowires. The filling factor varies approximately from d~0.07 to d~0.7 from the bottom to the middle of AlGaN nanowires.

A4. Laser Device Fabrication

Figure 4B:
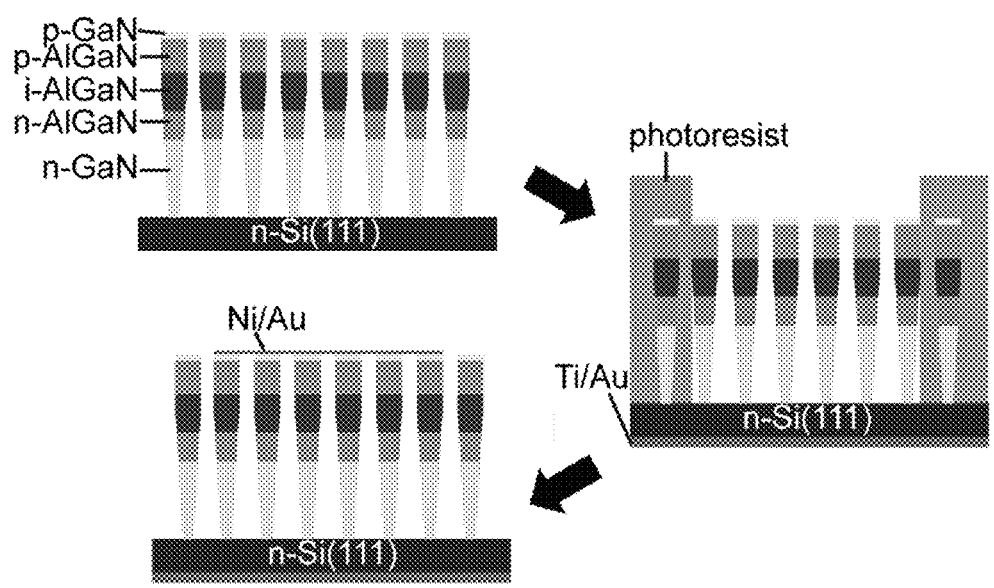
FIG. 4B depicts schematically the fabrication procedure for AlGaN nanowire laser devices according to embodiments of the invention.

Electrically injected laser devices were fabricated by the process described below and as depicted in respect of FIG. 4B. Firstly, Ti[10 nm]:Au[30 nm] n-metal layers were deposited onto the backside of n-Si substrate with an e-beam evaporator wherein the native silicon oxide on the backside of n-Si wafer had been removed by HF before metal deposition. Secondly, the sample was patterned into devices with different sizes by optical lithography. In addition, in contrast to prior reported self-organized light emitting devices fabricated by the inventors. No filling materials were utilized to avoid any light absorption in the UV-B spectral range. Accordingly, air holes exist amongst the nanowires. The top metal contact was deposited also by e-beam evaporation, with a tilting angle. Before metal deposition, the nanowire surface was etched by HCl solution to remove any surface oxide. The metallization for the top metal contact being Ni[10 nm]:Au[5 nm]. Rapid thermal annealing was carried out at 550° C. for 1 minute. Photoresist patterning was employed to define the mesa emission regions prior to top metal deposition such that device size was ~10 µm²

The devices were characterized under continuous-wave (CW) operation. The I-V characteristics measured at room temperature are shown in FIG. 5A where it can be seen that an excellent diode was formed with negligible leakage current. The device has a turn on voltage around 5 V. The excellent current-voltage characteristics measured, compared to conventional planar devices, is due to the significantly enhanced dopant incorporation in the near-surface region of nanowire structures and the resulting efficient charge carrier hopping conduction. The electroluminescence (EL) spectra were measured at room temperature from the nanowire top surface. The output light was collected by a deep UV objective, spectrally resolved by a high-resolution spectrometer, and detected by a liquid nitrogen cooled CCD.

Figure 5B:
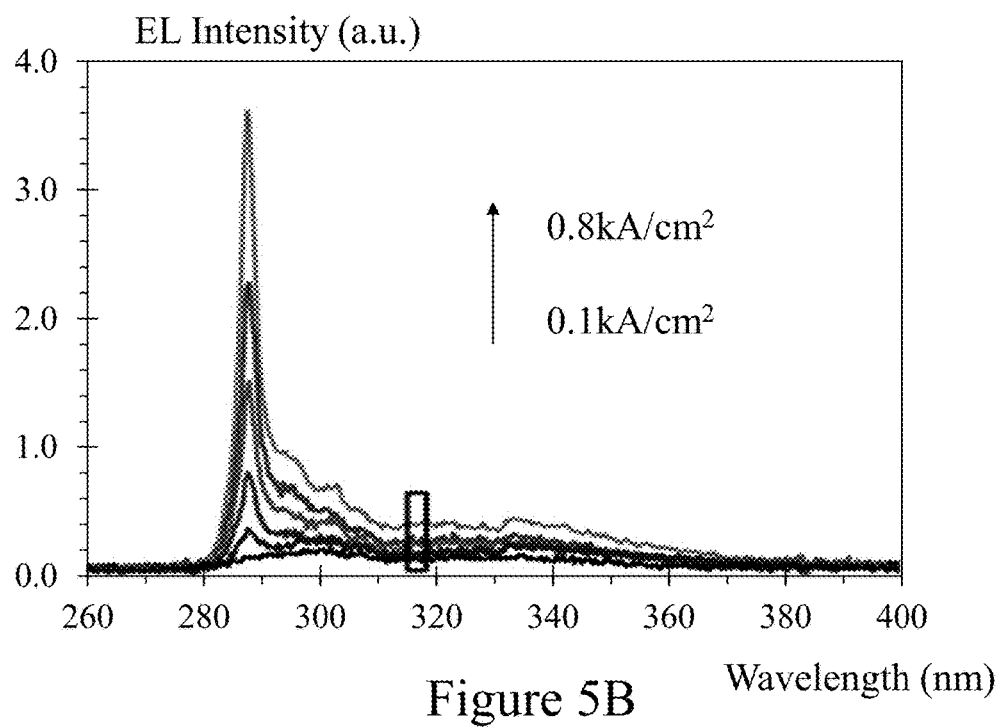
FIG. 5B depicts electroluminescent spectra measured under different injection currents for AlGaN nanowire lasers according to embodiments of the invention.
Figure 5C:
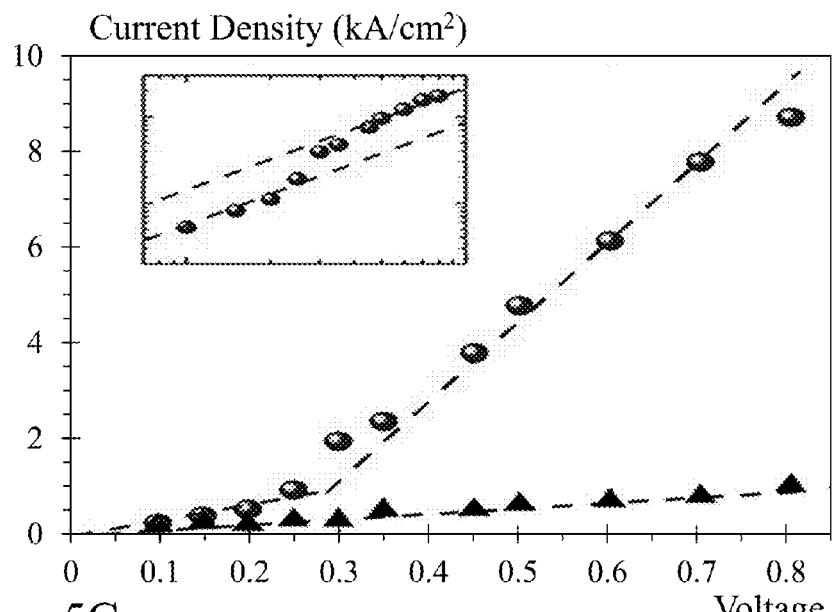
FIG. 5C depicts electroluminescent light versus current for $\lambda=289$ nm lasing peak and spontaneous emission for AlGaN nanowire lasers according to embodiments of the invention.

The EL spectra under different injection currents are shown in FIG. 5B. It is seen that at low injection currents (~100 A/cm2), only a very weak, broad emission spectrum (black curve) can be measured. As the injection current increases, an emission peak centered around 289 nm appears. It increases rapidly with injection current and becomes dominant at relatively high current densities. FIG. 5C shows the integrated EL intensity of the 289 nm peak vs. the injection current, which exhibits a clear threshold at ~300 A/cm2. Variations of the background emission with increasing current are also shown in FIG. 5C (black triangle), which was taken from the boxed region (spectral width ~3 nm) in FIG. 5B. Compared to the lasing peak at 289 nm, the integrated background emission shows a negligible increase above threshold, which is explained by the clamping of carrier concentration above threshold. The inset of FIG. 5C shows the L-I curve of the lasing peak at 289 nm in a logarithmic scale. Three distinct regions including spontaneous emission, amplified spontaneous emission, and lasing emission can be clearly observed, further providing an unambiguous evidence for the achievement of lasing. The lasing threshold of 300 A/cm2 is significantly smaller compared to the previously reported electrically injected quantum well lasers in the UV-A band (20 kA/cm2 at 336 nm). The extremely low lasing threshold is attributed to the drastically reduced transparency carrier density of 3D quantum-confined nanostructures, the nearly defect-free AlGaN core-shell nanowires, and the high Q optical cavity offered by Anderson localization.

Figure 5D:
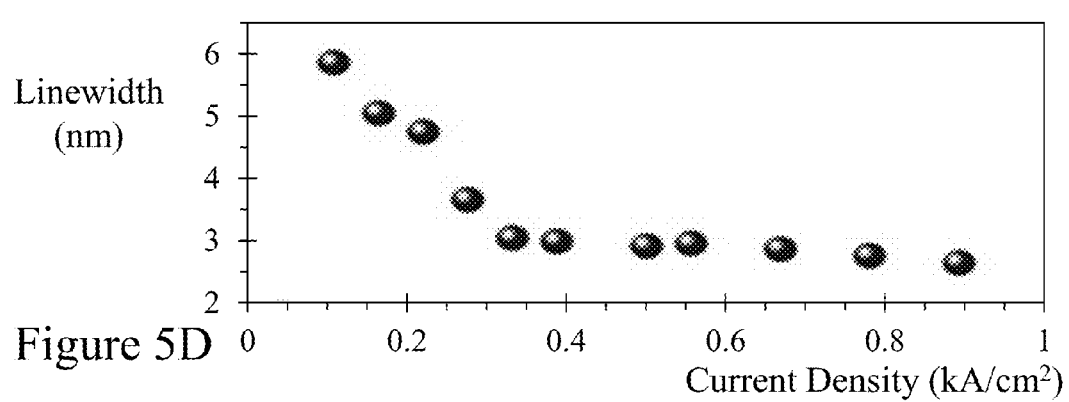
FIGS. 5D and 5E depict the linewidth and peak wavelength as a function of the injection current density, respectively, for AlGaN nanowire lasers according to embodiments of the invention.
Figure 5E:
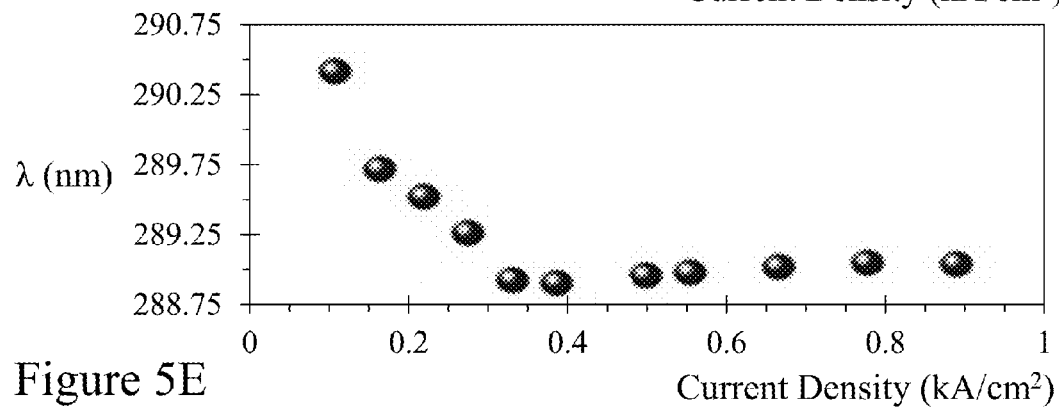
Figure 5F:
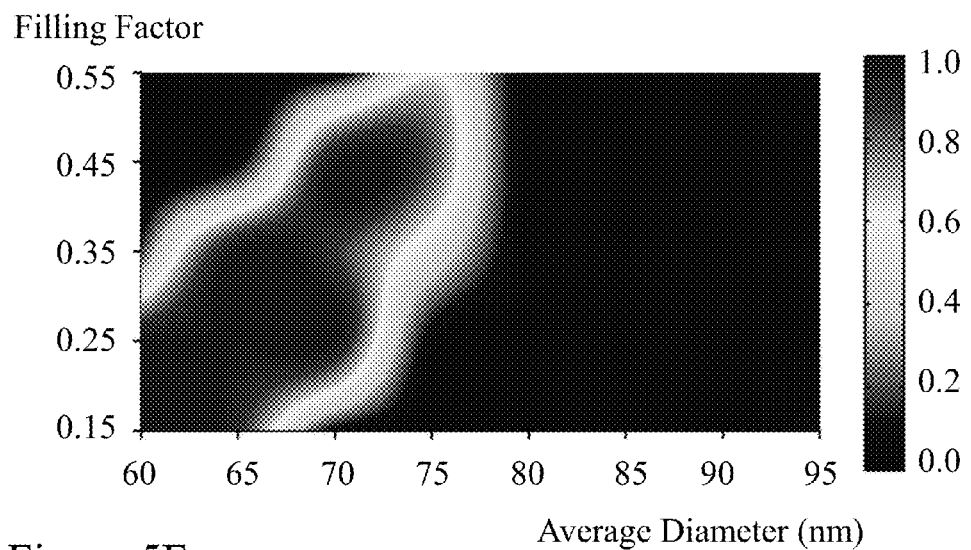
FIG. 5F depicts the probability of forming cavities of Q higher than 1000 for AlGaN nanowire lasers according to embodiments of the invention.

The derived linewidth versus injection current density is shown in FIG. 5D. It can be seen that as the injection current increases, the linewidth decreases from 6 nm below threshold to 2.6 nm above threshold, further confirming lasing action. The relatively broad lasing linewidth (2.6 nm) is likely related to the presence of multiple modes in the random cavity and the broad gain spectrum due to the size dispersion of quantum dots/dashes. Lasing wavelength versus injection current density was also investigated, illustrated in FIG. 5E. The wavelength is nearly invariant above threshold, suggesting stable exciton emission. The device output power is estimated to be in the range of µW, which is largely limited by the light absorption of the p-GaN and p-metal contact layers.

Accordingly, the inventors have demonstrated spontaneous formation of quantum dot/dash-like nanostructures in self-organized AlGaN nanowire arrays which through their resulting 3D quantum confinement, together with the nearly defect-free nanowire structures, drastically reduce the current density required for population inversion, leading to electrically injected AlGaN nanowire lasers with relatively low threshold at room-temperature. In this manner an electrically injected UV laser ($\lambda$~290 nm) has been established facilitating development of electrically injected small-scale deep UV lasers.

B: Self-Organizing Core-Shell Nanowire Heterostructures

B1: Growth

Figure 6A:
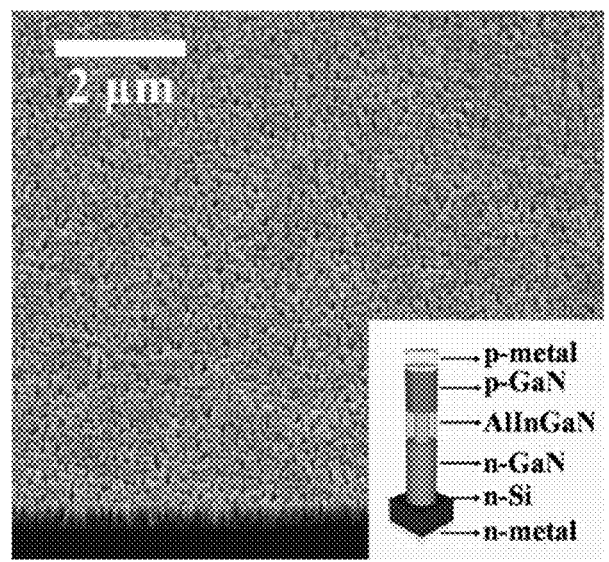
FIG. 6A depicts an SEM image of an AlInGaN core-shell nanowire array grown on a silicon substrate according to an embodiment of the invention with structural schematic shown in the inset.

The inventors grew catalyst-free AlInGaN core-shell nanowire LED heterostructures on Si(111) substrates using a radio frequency plasma-assisted MBE system under nitrogen-rich conditions as previously established by the inventors for growing high quality nanowires without foreign metal catalysts. Schematically as shown in the inset of FIG. 6A, the AlInGaN nanowire LED heterostructure consists of a lower segment of ~200 nm GaN:Si, 70 nm AlInGaN central region, and 150 nm GaN:Mg upper segment. During the growth, the nitrogen flow rate was kept at 1 standard cubic centimeter per minute (SCCM), with a forward power of 350 W. The GaN:Si and GaN:Mg segments were grown at ~700° C. For the AlInGaN active region, the substrate temperature was varied in the range of 620° C.≤T≤700° C. Also during the active region growth, the Ga beam equivalent pressure (BEP) was kept at $4.5 \times 10^{-8}$ Torr, whilst the In and Al BEP were varied from $1.2 \times 10^{-7}$ Torr≤$BEP_{In}$≤$2.6 \times 10^{-7}$ Torr and $2.9 \times 10^{-9}$ Torr≤$BEP_{Al}$≤$1.3 \times 10^{-8}$ Torr respectively.

B2: Analysis

Figure 6B:
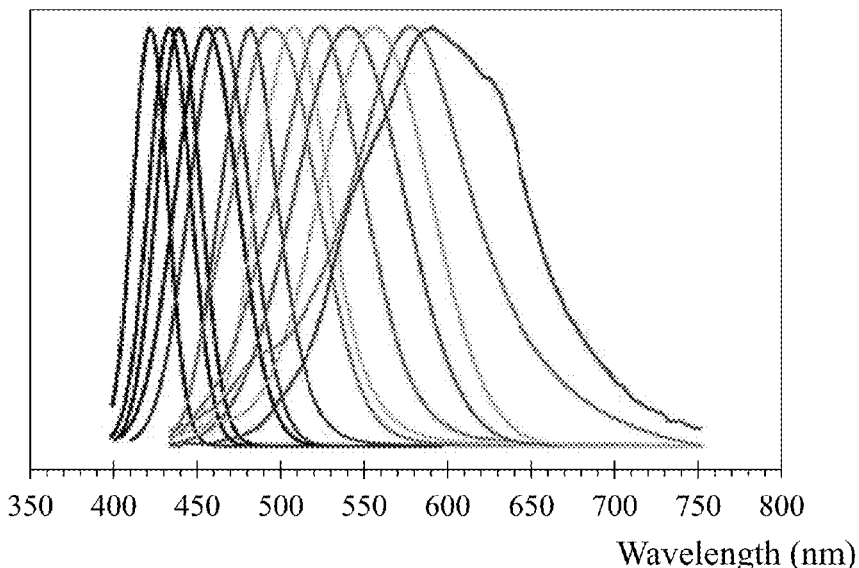
FIG. 6B depicts normalized photoluminescence spectra for AlInGaN core-shell nanowires according to embodiments of the invention under varying growth conditions.

Under growth conditions described above in Section B1 the photoluminescence (PL) emission wavelengths of AlInGaN quaternary nanowire structures can be continuously varied across nearly the entire visible spectral range, from 410 nm≤$\lambda_{PL}$≤630 nm as depicted in FIG. 6B. Moreover, through extensive studies and variations in the growth conditions by the inventors it was also found that the Al-rich shell thicknesses of AlInGaN quaternary nanowire heterostructures can be controllably varied, as described below, allowing for the direct correlation with the carrier dynamics and device performance. Referring to FIG. 1A there is depicted a scanning electron microscope (SEM) image of AlInGaN core-shell nanowires, which are vertically aligned on the Si(111) substrate. The nanowires exhibit a high degree of size uniformity, with the top sizes in the range of ~70-80 nm.

Within the following section the inventors describe the carrier dynamics and structural properties of three representative nanowire LED heterostructures, referred to as Samples A, B, and C, with peak emission wavelengths of 495-515 nm. The corresponding growth conditions and optical characterization results for these three representative nanowire LED heterostructures are described in Table 1. Growth temperatures of 625° C., 635° C. and 670° C. were used for the active regions of Samples A, B, C, respectively. Compared to Sample A, the Al BEP of Sample B was increased from 3.54×10-9 to 5.70×10-9 Torr. Relatively higher In and Al flux was utilized for Sample C in order to achieve enhanced shell coverage.

TABLE 1

Growth Conditions for Representative AlInGaN Segments

| Symbol | $BEP_{Al}$ ($\times 10^{-9}$ Torr) | $BEP_{In} \times 10^{-7}$ Torr | $T_{sample}$ (° C.) | $\lambda$ (nm) | $\tau_{Carrier}$ (ns) |
|---|---|---|---|---|---|
| A | 3.54 | 1.25 | 625 | 515 | 0.35 |
| B | 5.70 | 1.38 | 635 | 515 | 0.96 |
| C | 10.7 | 2.06 | 670 | 495 | 1.86 |

Figure 7:
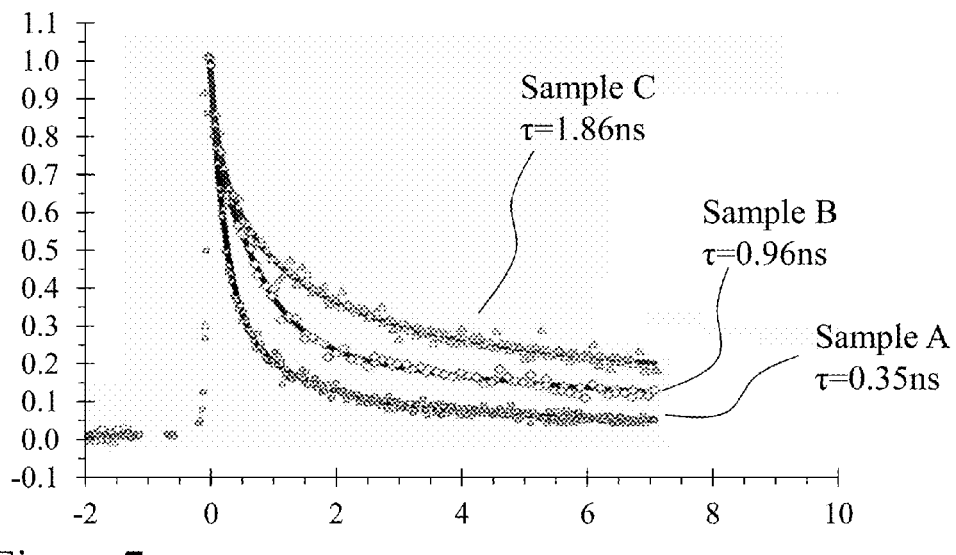
FIG. 7 depicts time-resolved photoluminescent emission of three representative AlInGaN core-shell nanowire LED heterostructures according to embodiments of the invention, exhibiting carrier lifetime of 0.35 ns, 0.96 ns and 1.86 ns.

Time-resolved PL measurements were performed to study the carrier dynamics of AlInGaN core-shell nanowire heterostructures. A pulsed 375 nm diode laser with a 100 MHz repetition rate was employed as the excitation source, which was focused on the sample surface through a 50× objective lens. The signal was detected by a photon counter with a $\lambda$>400 nm long pass filter. The carrier life time $\tau_{Carrier}$ was then derived by a standard stretched exponential model given by Equation (1) where I(t) is the PL intensity as a function of time, and n is the stretching parameter. Shown in FIG. 7 are the representative curves measured for samples A, B, and C, with the derived carrier lifetimes $\tau_{Carrier}$=0.35 ns, $\tau_{Carrier}$=0.96 ns, and $\tau_{Carrier}$=1.86 ns, respectively.

$$I(t) = I(0)e^{-(\frac{t}{\tau})^n} \quad (1)$$

Accordingly, the inventors established that measured carrier lifetimes of AlInGaN LED heterostructures vary dramatically depending on the nanowire growth conditions. For comparison, the carrier lifetime of a typical InGaN/GaN nanowire LED structure without the incorporation of any Al was measured to be in the range of 0.2 ns, dominated by non-radiative surface recombination (see Supplementary Information of Reference). The carrier lifetime of such InGaN/GaN nanowire LED structure was enhanced by the inventors to ~0.4 ns by adding an AlGaN shell. It is worth mentioning that the carrier lifetime remained nearly invariant when the excitation power was changed by over two orders of magnitude in the present study.

Figure 8A:
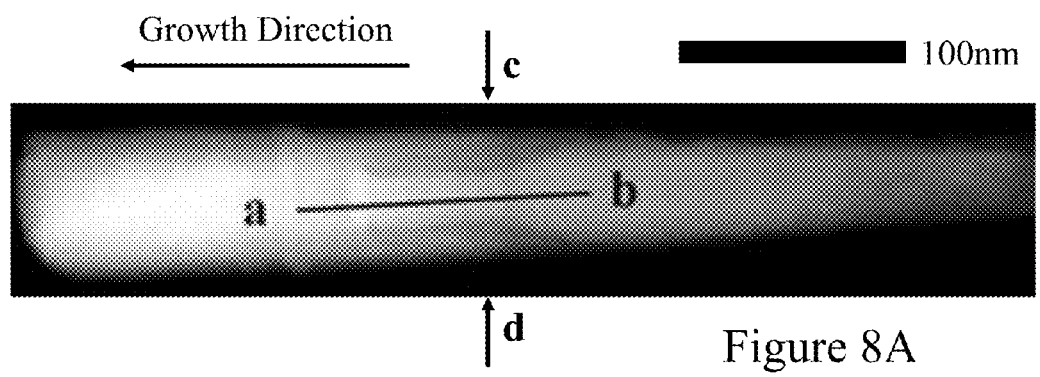
FIG. 8A depicts an HAADF-STEM image for the AlInGaN core-shell LED nanowire with shell thickness ~18.5 nm with a peak emission of $\lambda=495$ nm.
Figure 8B:
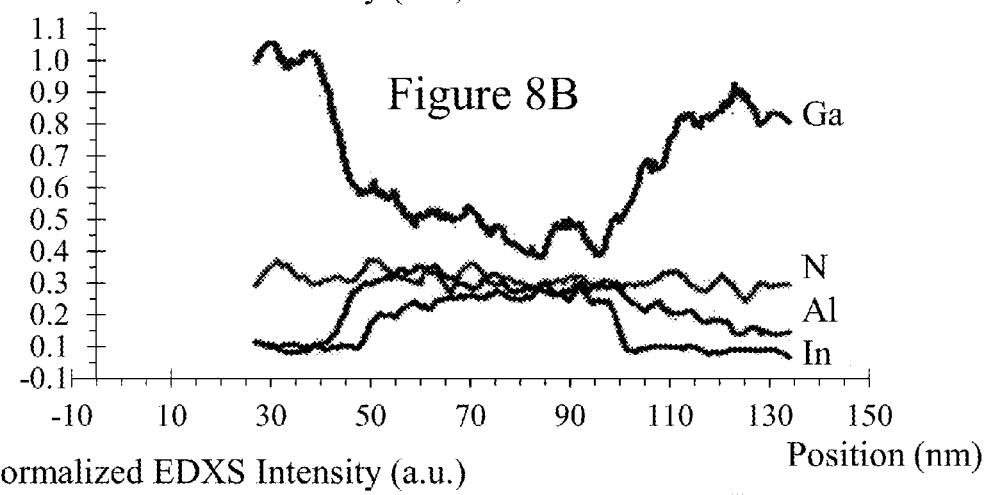
FIGS. 8B and 8C depict elemental profiles derived from EDXS line scanning analysis of the AlInGaN core-shell nanowire in Figure A in axial and radial directions respectively.
Figure 8C:
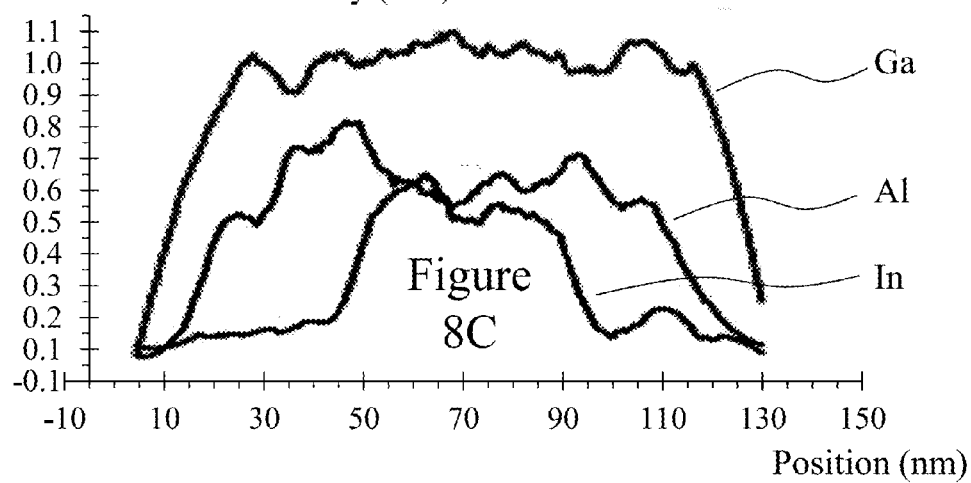

In order to further identify the correlation between the carrier dynamics of AlInGaN nanowire LED heterostructures and the associated growth conditions, the inventors performed extensive structural characterization by scanning transmission electron microscope (STEM). The high-angle annular dark-field (HAADF) atomic-number contrast image of a nanowire from Sample C (carrier lifetime $\tau_{Carrier}$=1.86 ns) is shown in FIG. 8A. The HAADF image shows bright contrast at the center and dark contrast at the sidewall of the AlInGaN segment, indicating the formation of a core-shell structure. The energy dispersive x-ray spectrometry (EDXS) analysis are shown in FIG. 8B, for Ga, Al, In, and N; and FIG. 8C for Ga, Al, and In. The elemental profiles along the growth direction (line a-b in FIG. 8A) as depicted in FIG. 8B present clearly one AlInGaN segment in the middle region and two GaN segments in the top and bottom regions of the nanowire. The tail of Al profile (position: 90-130 nm) originates from the direct impingement and diffusion of Al atoms at the sidewall of the bottom GaN:Si segment during the growth of AlInGaN active region. In FIG. 8C the EDXS axial line-scan analysis along the lateral dimension of the nanowire active region (line c-d in FIG. 8A) is presented. Here it can be seen that the Al and Ga signals extend over a much wider range than the In signal, providing unambiguous evidence that an AlGaN shell is formed surrounding an In-rich core region. The AlGaN shell thickness was estimated to be ~18.5 nm.

Similar STEM studies including HAADF and EDXS analysis were conducted on other nanowire samples. As a result, the inventors identified a direct correlation between the formation of an Al-rich shell structure and the carrier lifetime. For example, for Sample A, a small Al-rich shell was formed, due to the use of very low Al flux. Accordingly, the carrier lifetime for this sample was measured to be $\tau_{Carrier}=0.35$ ns, limited by non-radiative surface recombination. The AlGaN shell thicknesses were estimated to be ~13 nm for Sample B, which leads to enhanced carrier lifetime $\tau_{Carrier}=0.96$ ns, due to the reduced non-radiative surface recombination. The inventor's extensive structural and optical characterizations of AlInGaN nanowire heterostructures, not presented here, confirmed that the carrier lifetime increased with increasing AlGaN shell thickness.

The spontaneous formation of core-shell nanowire structures can be explained by the differences in the diffusion and desorption processes of In, Ga, and Al adatoms during the growth of the AlInGaN segment. At elevated growth temperatures, In atoms experience much stronger desorption compared to Ga and Al atoms on the nanowire lateral surfaces. The desorbed In atoms cannot be immediately compensated by impinging atoms, due to the shadowing effect of neighboring nanowires. As a consequence, an Al-rich shell is formed surrounding an In-rich core region. It is also evident that properties of the core-shell structures can be controlled by varying the substrate temperature, in addition to the group III/N flux ratios, since the sticking and diffusion coefficients of atoms are very sensitive to the substrate temperature.

In order to examine the impact of Al-rich shell structure on the device performance, we have fabricated and characterized large area AlInGaN nanowire LEDs with areal sizes of ~0.3×0.3 mm² to ~1.0×1.0 mm². The device fabrication process involves the use of polyimide surface passivation and planarization, standard photolithography and contact metallization techniques. As depicted by the insert in FIG. 6A, p- and n-contacts were deposited on the GaN:Mg and the Si substrate backside, respectively.

Figure 9A:
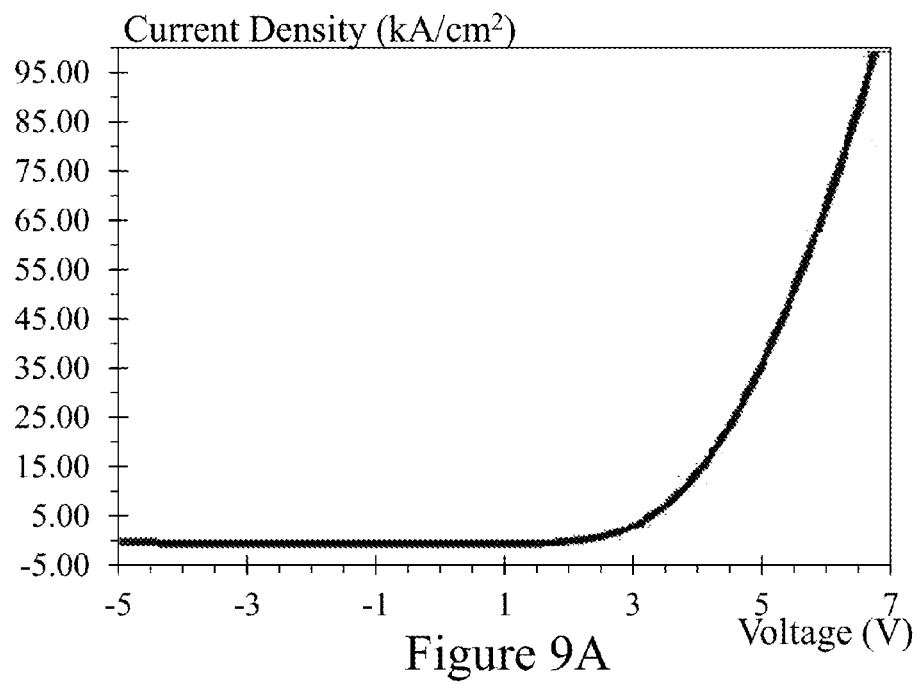
FIG. 9A depicts current-voltage characteristics of a representative AlInGaN nanowire LED on Si.
Figure 9B:
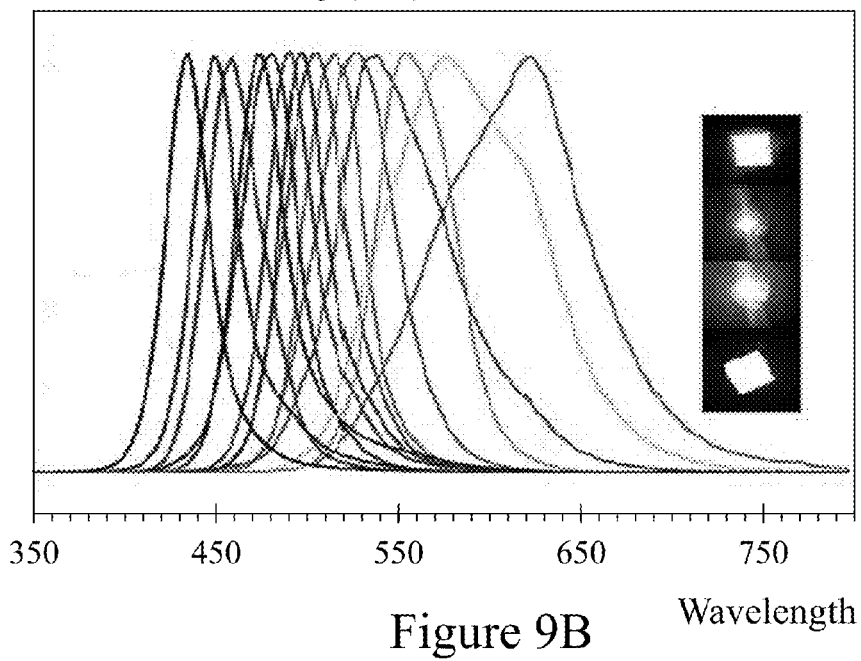
FIG. 9B depicts normalized electroluminescent spectra for AlInGaN core-shell nanowires LEDs grown under different conditions.
Figure 9C:
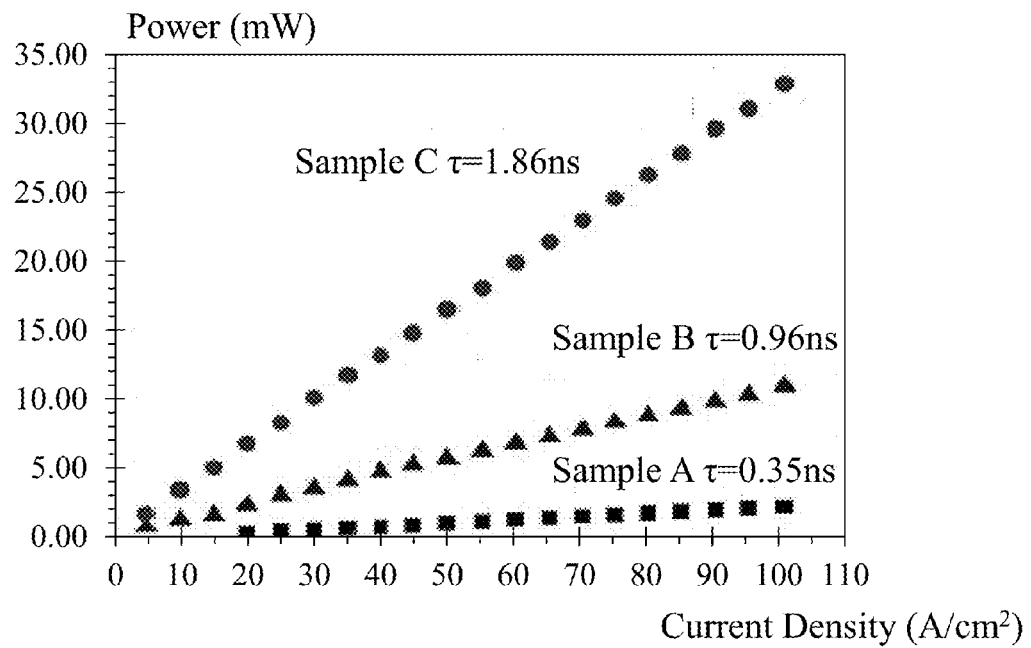
FIG. 9C depicts the optical output versus injection current for ~1 mm² AlInGaN nanowire array under pulsed biasing conditions.

Output characteristics of ~1.0×1.0 mm² AlInGaN core-shell LEDs were measured under various injection currents under pulsed biasing conditions (1% duty cycle) to minimize junction heating effect. Shown in FIG. 9A is a representative I-V curve of AlInGaN core-shell nanowire LEDs fabricated by the inventors according to embodiments of the invention, which exhibit excellent current-voltage characteristics. The measured electroluminescence (EL) spectra of various AlInGaN nanowire LEDs are shown in FIG. 9B. Tunable emissions from 410 nm $\leq \lambda_{Emission} \leq$ 630 nm can be readily achieved. Variations of the output power versus injection current density for a few representative LED structures are further shown in FIG. 9C. It is evident that significantly higher output power can be achieved for nanowire LEDs with longer carrier lifetime, due to the suppression of non-radiative surface recombination, e.g. comparing Sample C to Sample A. Under an injection current density of 100 Acm$^{-2}$, an output power of >30 mW was measured for Sample C, which is significantly higher than that of previously reported axial InGaN nanowire LEDs within the prior art.

Figure 9D:
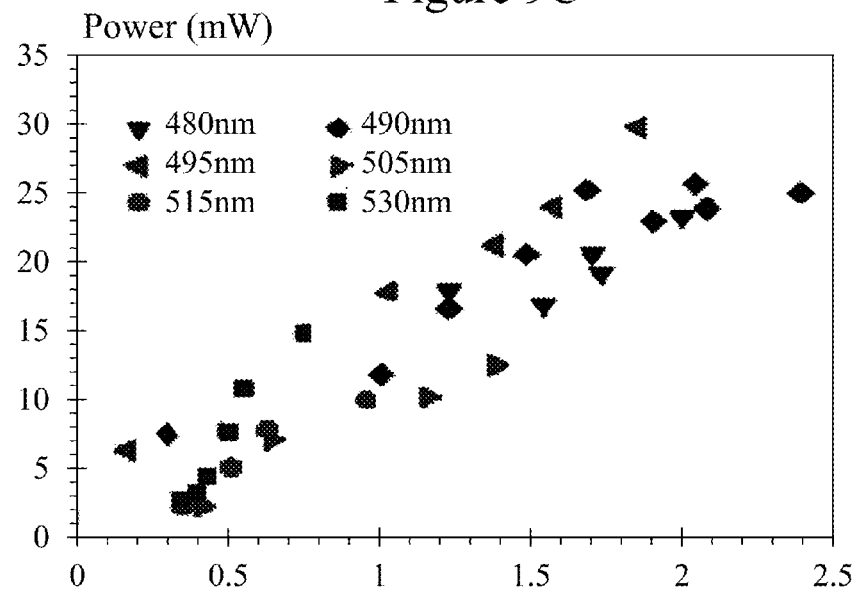
FIG. 9D depicts variations of the optical output of AlInGaN core-shell nanowires LEDs measured under injection currents of 90 Acm$^{-2}$ versus carrier lifetime of the nanowire heterostructure.

Variations of the measured output power at an injection current density of 90 Acm$^{-2}$ versus carrier lifetime are further summarized in FIG. 9D for LEDs operating in the blue-green wavelength range (410 nm $\leq \lambda_{Emission} \leq$ 530 nm). It is seen that the output power increases dramatically with carrier lifetime, which is also consistent with recent reports on AlGaN/InGaN dot-in-a-wire LEDs by the inventors. Such studies provide unambiguous evidence that robust core-shell structures are extremely beneficial in suppressing any non-radiative surface recombination and to achieve high power operation for axial nanowire devices. The direct correlation between carrier lifetime and device performance also rules out the possibility that the enhanced carrier lifetime is caused by the quantum-confined Stark effect (QCSE) with increasing Al incorporation, since QCSE generally leads to reduced efficiency and output power.

Accordingly, the inventors have demonstrated full-color AlInGaN core-shell quaternary nanowire LEDs grown directly onto Si substrates wherein through controlled growth parameters the spontaneous formation of an In-rich core and Al-rich shell structure occurs establishing a radial carrier confinement which can suppress the undesirable non-radiative surface recombination, leading to enhanced carrier lifetime and significantly increased output power.

Whilst the principle has been established in respect of AlInGaN nanowires other compound semiconductor nanowire structures may be engineered to yield such a radial carrier confinement thereby suppressing undesirable non-radiative surface recombination at the nanowire surface.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A device comprising:
    a plurality of nanowires grown on a substrate, each nanowire of the plurality of nanowires having a respective diameter over a region of its length within a same range of diameters, the plurality of nanowires also having a filling factor over a region of the substrate; and
    upper and lower electrical contacts formed on the plurality of nanowires;
    wherein the plurality of nanowires coherently emit optical radiation through Anderson localization of light.

2. The device according to claim 1, wherein the nanowires are each formed from a compound semiconductor and comprise three dimensional charge carrier confinement structures formed by atomic scale compositional modulations within the compound semiconductor along a portion of the length of each of the nanowires.

3. The device according to claim 1, wherein the nanowires are each formed from a compound semiconductor and comprise three dimensional charge carrier confinement structures formed by atomic scale compositional modulations within the compound semiconductor along a first portion of the length of the nanowires; and the nanowires each has a shell-core structure within a second portion of the length of each of the nanowires, wherein a concentration of an element within the shell is higher than a concentration of the element within the core.

4. The device according to claim 1, wherein the plurality of nanowires are formed from AlGaN and the optical radiation is within the deep ultraviolet.

5. The device according to claim 1, wherein each nanowire of the plurality of nanowires is tapered, wherein the respective diameter of said each nanowire increases as distance from the substrate increases.

6. The device according to claim 1, wherein the range of diameters is 60 nanometers to 75 nanometers, and wherein the filling factor is between 15 percent and 55 percent.

7. A method comprising:

growing a plurality of nanowires on a substrate, each nanowire of the plurality of nanowires having a respective diameter over a region of its respective length that is within a same range of diameters, the plurality of nanowires also having a filling factor over a region of the substrate; and forming upper and lower electrical contacts on the plurality of nanowires;

wherein the plurality of nanowires coherently emit optical radiation through Anderson localization of light.

8. The method according to claim 7, wherein the nanowires are each a compound semiconductor grown in a nitrogen rich atmosphere with a first Group III element precursor and comprise three dimensional charge carrier confinement structures formed by atomic scale compositional modulations within the compound semiconductor along a portion of the length of each of the nanowires.

9. The method according to claim 7, wherein the nanowires are each a compound semiconductor grown in a nitrogen rich atmosphere with a first Group III element precursor and comprise three dimensional charge carrier confinement structures formed by atomic scale compositional modulations within the compound semiconductor along a first portion of the length of each of the nanowires by increasing the concentration of a second Group III element above a threshold; and the nanowires each has a shell-core structure within a second portion of the length of the nanowires, wherein a concentration of the second Group III element within the shell is higher than a concentration of the second Group III element within the core.

10. The method according to claim 7, wherein the plurality of nanowires are formed from AlGaN and the optical radiation is within the deep ultraviolet.

* * * * *